(12) United States Patent
Grill

(10) Patent No.: US 12,326,703 B2
(45) Date of Patent: Jun. 10, 2025

(54) SETTING DEVICE FOR SETTING AN EFFECTIVE VALUE OF AN ELECTRIC LOAD CURRENT AT A TIME-VARIANT LOAD

(71) Applicant: Continental Automotive GmbH, Hannover (DE)

(72) Inventor: Thilo Grill, Darmstadt (DE)

(73) Assignee: Continental Automotive Technologies GmbH, Hannover (DE)

( * ) Notice: Subject to any disclaimer, the term of this patent is extended or adjusted under 35 U.S.C. 154(b) by 418 days.

(21) Appl. No.: 17/442,500

(22) PCT Filed: Mar. 24, 2020

(86) PCT No.: PCT/EP2020/058219
§ 371 (c)(1),
(2) Date: Sep. 23, 2021

(87) PCT Pub. No.: WO2020/193579
PCT Pub. Date: Oct. 1, 2020

(65) Prior Publication Data
US 2022/0153342 A1 May 19, 2022

(30) Foreign Application Priority Data
Mar. 25, 2019 (DE) ..................... 10 2019 204 030.6

(51) Int. Cl.
*G05B 19/04* (2006.01)
*H01F 7/06* (2006.01)
(Continued)

(52) U.S. Cl.
CPC ............. *G05B 19/04* (2013.01); *H01F 7/064* (2013.01); *H03K 5/156* (2013.01); *B62D 5/07* (2013.01);
(Continued)

(58) Field of Classification Search
CPC .......... G05B 19/04; B62D 5/07; H03K 5/1565
See application file for complete search history.

(56) References Cited

U.S. PATENT DOCUMENTS

| 5,021,727 A | 6/1991 | Mashino |
| 2008/0100362 A1 | 5/2008 | Gizara |

(Continued)

FOREIGN PATENT DOCUMENTS

| CN | 102022245 A | 4/2011 |
| CN | 103259513 A | 8/2013 |

(Continued)

OTHER PUBLICATIONS

J. Weigold and M. Braun, "Robust Predictive Dead-Beat Controller for Buck Converters," 2006 12th International Power Electronics and Motion Control Conference, Portoroz, Slovenia, 2006, pp. 951-956 (Year: 2006).*

(Continued)

*Primary Examiner* — Scott T Baderman
*Assistant Examiner* — Seung Woon Jung

(57) ABSTRACT

A controller device for controlling an effective value of an electric load current at a time-variant load is provided. The controller device provides at the time-variant load a voltage pulse sequence having a duty cycle in at least one pulse phase of the voltage pulse sequence. A sample value of the electric load current is acquired at the time-variant load, to determine an actual effective value of the electric load current using a dependency stored in the controller device. The actual effective value is assigned to the sample value of the electric load current. A difference value between the actual effective value of the electric load current and a setpoint effective value of the electric load current is determined, and adapted duty cycle of the voltage pulse sequence is determined from the difference value, and provides at the (Continued)

time-variant load an adapted voltage pulse sequence having the adapted duty cycle.

13 Claims, 6 Drawing Sheets

(51) Int. Cl.
*H03K 5/156* (2006.01)
*B62D 5/07* (2006.01)
*G05B 17/02* (2006.01)
*G05B 23/00* (2006.01)
*H03K 7/08* (2006.01)

(52) U.S. Cl.
CPC ............ *G05B 17/02* (2013.01); *G05B 23/00* (2013.01); *G05B 2219/2637* (2013.01); *H03K 5/1565* (2013.01); *H03K 7/08* (2013.01)

(56) References Cited

U.S. PATENT DOCUMENTS

| | | |
|---|---|---|
| 2010/0204871 A1 | 8/2010 | Bange et al. |
| 2011/0062138 A1 | 3/2011 | Blanc et al. |
| 2015/0207395 A1 | 7/2015 | Schwarzmann et al. |
| 2016/0228914 A1* | 8/2016 | Bales, Jr. .............. B06B 1/0223 |
| 2019/0020336 A1 | 1/2019 | Abe |

FOREIGN PATENT DOCUMENTS

| | | | |
|---|---|---|---|
| CN | 104541341 A | 4/2015 | |
| DE | 102007032178 B3 | 12/2008 | |
| DE | 102010000885 A1 * | 7/2011 | ........... H01F 7/1844 |
| EP | 1014247 A2 | 6/2000 | |
| JP | 2019022294 A | 2/2019 | |

OTHER PUBLICATIONS

Gene Markel, "Power Steering: Understanding the Dynamics and Diagnostics", a TireReview newsletter published at Mar. 8, 2016, captured and printed at https://www.tirereview.com/157231/, 5 pages. (Year: 2016).*

Jeong et al., "All-Digital Duty-Cycle Corrector With a Wide Duty Correction Range for DRAM Applications," in IEEE Transactions on Very Large Scale Integration (VLSI) Systems, vol. 24, No. 1, pp. 363-367 (Year: 2016).*

International Search Report and Written Opinion dated Jun. 26, 2020 from corresponding International Patent Application No. PCT/EP2020/058219.

Chinese Office Action dated Sep. 28, 2023 corresponding with Chinese Patent Application No. 202080024381.0.

* cited by examiner

| 16 | 95 | 157 | 226 | 286 | 338 | 397 | 450 | 503 | 554 | 603 | 695 |
|----|----|-----|-----|-----|-----|-----|-----|-----|-----|-----|-----|
| 11 | 50 | 100 | 150 | 200 | 250 | 300 | 350 | 400 | 450 | 500 | 600 |

Fig.5

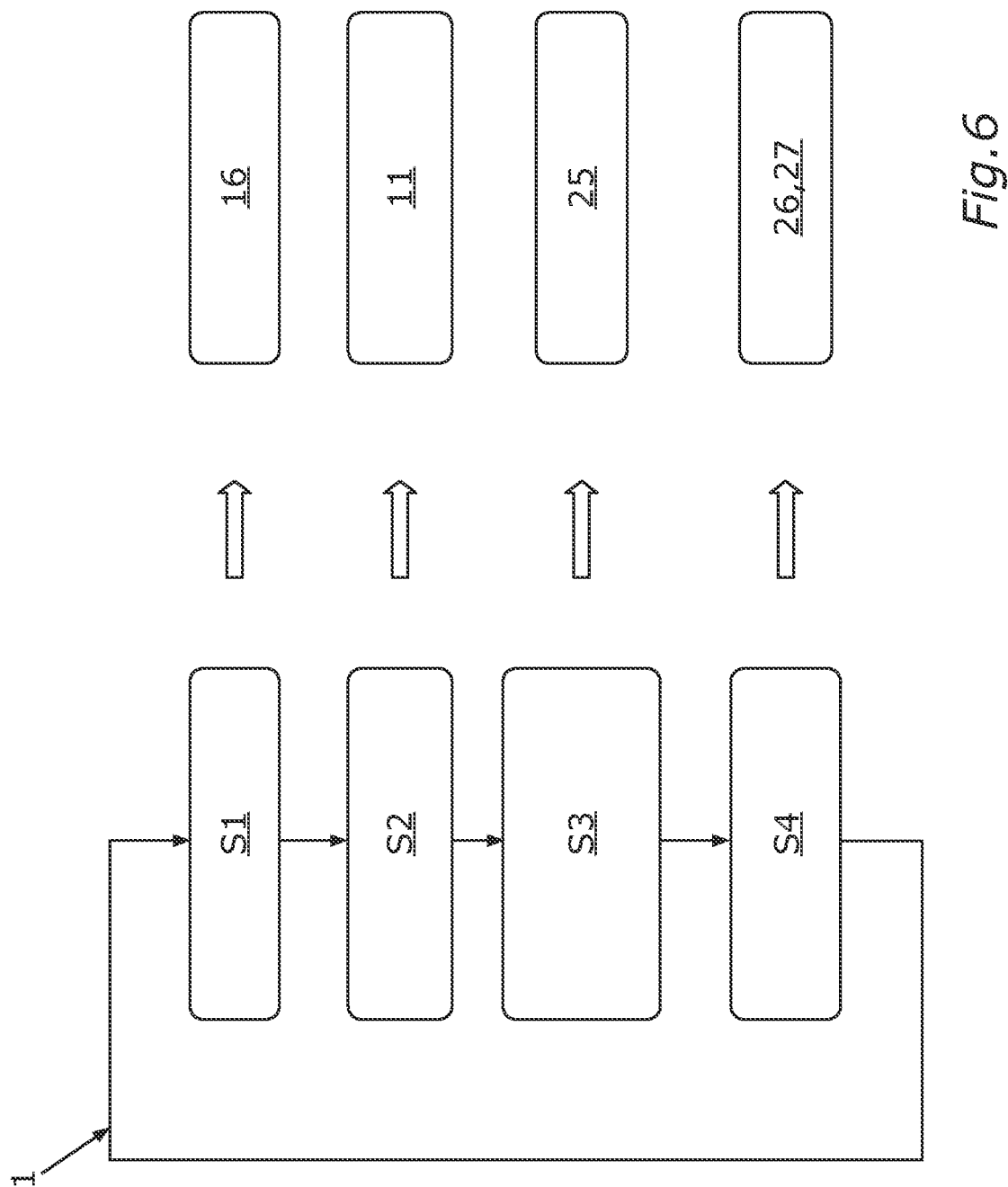

SETTING DEVICE FOR SETTING AN EFFECTIVE VALUE OF AN ELECTRIC LOAD CURRENT AT A TIME-VARIANT LOAD

CROSS-REFERENCE TO RELATED APPLICATION

This U.S. patent application claims the benefit of PCT patent application No. PCT/EP2020/058219, filed Mar. 24, 2020, which claims the benefit of German patent application No. 10 2019 204 030.6, filed Mar. 25, 2019, both of which are hereby incorporated by reference.

TECHNICAL FIELD

The invention relates to a controller device for controlling an effective value of an electric load current at a time-variant load, to a vehicle comprising a controller device, and to a method for operating the controller device.

BACKGROUND

Solenoid values are used in order to govern a hydraulic flow in hydraulic-assisted power steering in a vehicle. The position of the solenoid valve depends on an effective value of an electric load current flowing through the solenoid valve.

The load current is produced by means of a voltage pulse sequence applied to the solenoid valve. A defined setpoint effective value of the load current is adjusted by means of pulse width modulation of the voltage pulse sequence. The effective value of the electric load current depends on a duty cycle of the voltage pulse sequence. In order to control the effective value to a predetermined setpoint effective value of the load current, it is necessary to acquire an actual effective value of the load current and to compare this with the setpoint effective value.

Acquiring the actual effective value of the electric load current presents the problem that the solenoid valve is an inductive, and therefore time-variant, load. As a result, the curve of the load current is a complex curve, in particular an exponential curve of time constant tau ($\tau$), which defines the length of time until the magnitude of the load current has halved (half-life) or doubled or decreased by the factor $1/e$ (e=Euler's constant) or increased by the factor $(1-1/e)$. It is therefore necessary to determine the effective value by measurement. This can be done by summing the current-curve and then averaging by means of analog circuitry using an integrator. An alternative to this involves high-frequency sampling of the load-current curve. In this case, a program in a control unit performs the summation and subsequent averaging. The control unit needs sufficient processor power in order to analyze the sample values in the required time. A measurement shunt is needed in both cases to ensure a specified accuracy.

A disadvantage with the described methods for determining the actual effective value of the load current is that the controller device comprises a large number of electronic components for acquiring the actual effective value of the load current. This results in increased manufacturing effort and costs.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Therefore, it is desireable the number of components required for determining an actual effective value of an electric load current at a time-variant load.

A controller device for controlling an effective value of an electric load current at a time-variant load is provided. The controller device is designed to provide at the time-variant load a voltage pulse sequence that has a predetermined duty cycle. The controller device is designed to acquire a sample value of the electric load current at the time-variant load in at least one pulse phase of the voltage pulse sequence. In other words, the controller device is intended to acquire during at least one pulse phase of the voltage pulse sequence, at a predetermined sampling time, the sample value, this being an instantaneous magnitude of the electric load current at the sampling time. The predetermined sampling time can depend on a phase angle of the voltage pulse sequence.

The controller device is designed to determine by means of a dependency stored in the controller device an actual effective value of the electric load current, which value is assigned to the sample value of the electric load current. In other words, provided in the controller device is the dependency that makes it possible to determine for the acquired sample value of the electric load current the corresponding actual effective value of the electric load current. For example, the dependency can be a characteristic-value table or a calculation rule (mathematical function), each of which can be stored in the controller device. The controller device is designed to determine a difference value between the actual effective value of the electric load current and a predetermined setpoint effective value of the electric load current. In other words, the controller device is designed to compare the determined actual effective value of the electric load current with the setpoint effective value of the electric load current in order to determine the difference value.

The controller device is designed to determine an adapted duty cycle of the voltage pulse sequence from the difference value of the electric load current according to a predetermined method (control method), and to provide at the time-variant load a modified or adapted voltage pulse sequence having the adapted duty cycle. In other words, the controller device is designed to modify the duty cycle of the voltage pulse sequence according to the determined difference value of the electric load current, and to provide the adapted voltage pulse sequence having the adapted duty cycle in order to reduce the difference value. Thus, while the voltage pulse sequence is being generated, its duty cycle in one pulse phase or in a plurality of pulse phases can be modified according to the actual effective value determined in that particular pulse phase. The duty cycle can thus be a manipulated variable. Said control method may be based on PID control (PID—proportional, integral, differential) or PI control, for example.

The controller device may determine the actual effective value of the electric load current from the sample value. Thus, the there is no need for integration over the current-curve in order to determine the actual effective value of the electric load current. It is thereby possible to determine the actual effective value of the electric load current without an integrator or a control unit, whereby the number of components required can be reduced.

A development provides that the dependency comprises a characteristic-value table. In other words, the dependency comprises a table in which discrete sample values are each assigned the corresponding actual effective value of the load current. Therefore, no calculation operations by the controller device are needed in order to determine the actual effective value. It can be provided, for example, that the characteristic-value table is a conversion table, from which it is possible to retrieve the corresponding actual effective value for the particular acquired sample value. A conversion table of said type is also referred to as a lookup table.

A development provides that the dependency comprises a characterizing function. In other words, the dependency comprises a mathematical function that makes it possible to calculate for the particular sample value the corresponding actual effective value of the electric load current. Therefore, the actual effective value may be determined for a continuous range of sample values. It can be provided, for example, that the characterizing function is a model function, which has been approximated to measurement points that describe a relationship between the particular sample value and the corresponding actual effective value of the electric load current.

A development of the invention provides that the controller device is designed to provide the voltage pulse sequence at a period of 1.5 ms to 3.5 ms, for example. In other words, the controller device is designed to generate the voltage pulse sequence having the period 1.5 ms to 3.5 ms. Therefore, the controller device can provide the usual period. The period may be 2.5 ms, for example.

In principle, it is possible to perform control, i.e. to adapt the duty cycle in the manner described, with each period. In this case, the pulse duration of the voltage pulse sequence may be less than 5*tau of the time-variant load (tau=time constant of the time-variant load). A development accordingly provides that the controller device is designed to set a pulse duration of less than 5*tau of the time-variant load, where tau is said time constant of the time-variant load, and to determine, in a plurality of, or all, pulse phases of the voltage pulse sequence, the duty cycle according to a sample value obtained in the corresponding pulse phase. In other words, the described steps for adapting or modifying the duty cycle can be performed in some, or all, pulse phases of the voltage pulse sequence. Therefore, it is possible to react to changes over time.

A development provides that the controller device is designed to provide the voltage pulse sequence as a square wave signal. In other words, the controller device is designed to generate as the voltage pulse sequence a square wave signal, wherein a voltage of the voltage pulse sequence varies between two voltage levels. The two voltage levels are an upper voltage level and a lower voltage level. A region comprising a high-voltage value can constitute a pulse of the voltage pulse sequence and can have a pulse duration. Therefore, simple switches can be used to generate the voltage pulse sequence.

A development provides that the controller device is designed to acquire the sample value of the electric load current at an acquisition period that is an integer multiple of the period of the voltage pulse sequence. In other words, the controller device is designed to acquire the sample value of the electric load current at regular intervals, where the acquisition period between the acquisition of the sample value is an integer multiple of the period of the voltage pulse sequence. Therefore, the sample value is acquired at identical phases of the voltage pulse sequence.

A development provides that the dependency is specific to the particular time-variant load and the particular controller device. In other words, the particular controller device is calibrated for the particular time-variant load applied to the controller device, so that the dependency specifies the relationship between the sample value and the actual effective value for a particular combination of the particular controller device and the particular time-variant load. Therefore, it is possible to correct for production variations arising both in the controller devices and in time-variant loads. For example, a production-related variation in the acquisition of the sample values can exist between individual controller devices. The time-variant loads may have production variations, which result in differences between the various time curves of the load current of different solenoid valves. This can be attributed to differences in the inductances of the respective solenoid valves, for example. These variations are corrected by determining the dependency for a particular pair of controller device and load.

A development provides that the controller device is designed to acquire the sample value of the electric load current in a final tenth of the pulse phase. In other words, the sampling time lies in the final tenth of each pulse phase. Therefore, the sample value is acquired at a time at which the rise in the load current is less than at the start of the pulse phase.

A development provides that the controller device is designed to acquire the sample value of the electric load current during a falling signal edge of a pulse of the voltage pulse sequence. In other words, the sampling time for the sample value lies in a falling phase, in which the voltage value is falling from the high-voltage value to the low-voltage value. Therefore, the time at which the sample value is acquired can be triggered by the signal edge.

A development provides that the controller device comprises a power MOSFET. In other words, the controller device comprises a metal-oxide-semiconductor field-effect transistor, which is designed for controlled conduction and blocking of electric currents and voltages. This may be what is known as a smart FET, which comprises a control unit and a pulse-width controller (PWM controller) for controlling the effective value of the load current by means of the duty cycle.

A vehicle comprising a controller device for controlling an effective value of an electric load current at a time-variant load may also be provided. In particular, the vehicle may be a motor vehicle such as a heavy goods vehicle or a motor car. The controller device can be designed, for example, to control an effective value of an electric load current in a solenoid valve as a time-variant load.

A method for controlling an effective value of an electric load current at a time-variant load is also provided. It is provided in the method that a controller device provides successively at a time-variant load a plurality of calibration voltage pulse sequences, where each calibration voltage pulse sequence has a particular duty cycle. In other words, a plurality of calibration voltage pulse sequences are generated for a calibration, with the respective calibration voltage pulse sequences differing from one another in terms of the duty cycle. The controller device acquires a sample value of the electric load current of the time-variant load in at least one pulse phase of the respective calibration voltage pulse sequences. In other words, the relevant sample value is acquired for each of the calibration voltage pulse sequences.

A sensor unit acquires an actual effective value of the electric load current at the time-variant load for at least one period of the respective calibration voltage pulse sequences. In other words, during the calibration, the sensor unit acquires the relevant actual effective value of the electric load current for each of the calibration voltage pulse sequences. The sensor unit can be designed, for example, to acquire and integrate a curve of the load current, and to determine therefrom the actual effective value. For example, the sensor unit can be a multimeter, which can be connected to the time-variant load and to the controller device for the purpose of the calibration.

After the calibration, the sensor unit can be disconnected from the controller device and the time-variant load. The actual effective value of the electric load current is determined for at least one period of the respective calibration voltage pulse sequences. The actual effective value of the electric load current, which value acquired is by the sensor unit, is transferred to the controller device. The controller device generates and stores a dependency, in which the respective sample values of the electric load current and the respective duty cycles of the calibration voltage pulse sequences are assigned the corresponding actual effective value of the electric load current. In other words, the controller device generates the dependency, in which is stored the corresponding actual effective value for each sample value and duty cycle. This may be performed by a control unit of the controller device, for example. Said dependency can be stored in the control unit. This allows the controller device to determine the actual effective value of the electric load current by means of the dependency for the particular sample value and the particular duty cycle.

In a next step, the controller device provides at the time-variant load a voltage pulse sequence having a predetermined duty cycle. The controller device acquires the sample value of the electric load current at the time-variant load in at least one pulse phase of the voltage pulse sequence. The controller device determines by means of the dependency stored in the controller device the actual effective value of the electric load current, which value is assigned to the sample value of the electric load current and to the duty cycle of the voltage pulse sequence. In other words, the controller device uses the dependency to determine the actual effective value of the electric load current.

In a subsequent step, the controller device determines a difference value between the actual effective value of the electric load current and a setpoint effective value of the electric load current. An adapted duty cycle of the voltage pulse sequence is determined from the difference value according to a predetermined method (control method). The adapted duty cycle is used to provide an adapted voltage pulse sequence in order to reduce the difference value of the electric load current.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

An exemplary embodiment of the invention is described below. In this respect:

FIG. 5 shows a dependency 4;
and
FIG. 6 shows a possible sequence of a method.

DETAILED DESCRIPTION

In the exemplary embodiment explained below, the described components of the embodiment each represent individual features that should be considered independently of one another, and therefore also be considered to be part of the invention individually or in a combination other than that shown. Furthermore, the embodiment described can also be supplemented by further features that have already been described.

In the figures, elements with the same function are each provided with the same reference signs.

Figure 1:
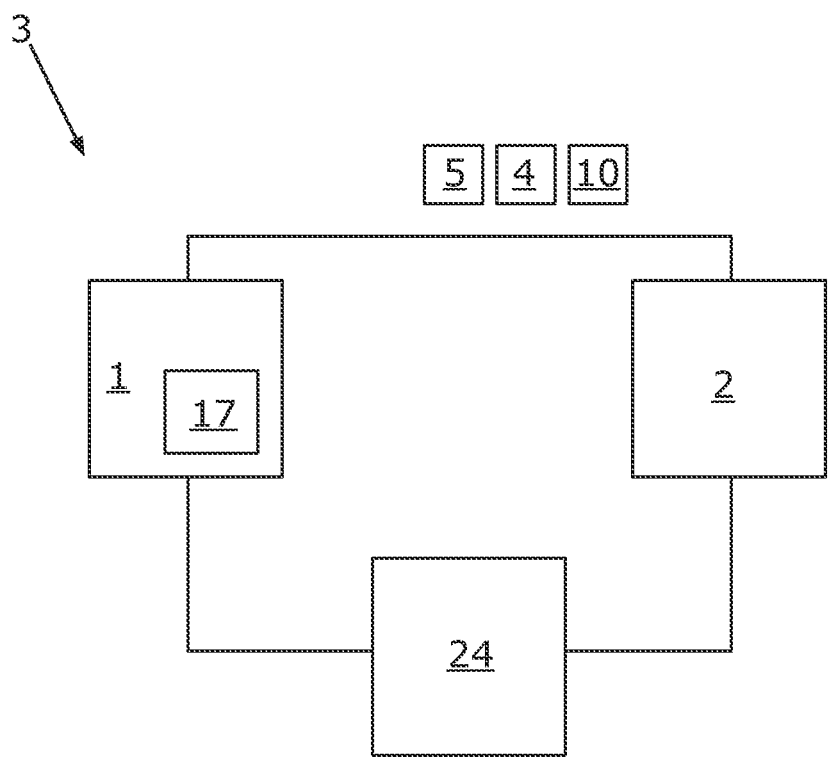
FIG. 1 shows a controller device 1.

FIG. 1 shows a controller device 1, which is connected in an electrically conductive manner to a time-variant load 2. The controller device 1 may comprise a smart FET, for example. The time-variant load 2 may be a solenoid valve for governing a hydraulic flow in power assisted steering of a vehicle 3. The controller device 1 can be designed to provide a voltage pulse sequence 4 in order to provide at the time-variant load 2 an electric load current 5 having a predetermined setpoint effective value 6. The voltage pulse sequence 4 may be designed as a square wave function, for instance, and may have a period 7. The voltage pulse sequence 4 can comprise pulses 8 having a pulse duration 9. The ratio between the pulse duration 9 and the period 7 can be specified by the duty cycle 10. The time-variant load 2 may be the solenoid valve, for example, where a degree of opening of the solenoid valve can depend on an actual effective value 11 of the electric load current flowing through the time-variant load 2. The time-variant load 2 can comprise inductances, as a result of which the load current 5 can rise exponentially or fall exponentially. By the controller device 1 adjusting the duty cycle 10, it can be possible to adjust the actual effective value 11 of the electric load current to the setpoint effective value of the electric load current 5.

The controller device 1 can be used in power assisted steering in the vehicle 3. A required engine power can depend here on an extent of the intervention by the power assisted steering. The extent of the intervention of the power assisted steering can be adjusted by means of a solenoid valve. The solenoid valve may be a proportional valve, which is actuated and/or controlled by the controller device 1. The solenoid valve can behave as follows in this process. The valve can be closed when there is a high electric load current 5 through the valve. This can minimize a hydraulic flow in a hydraulic circuit of the power assisted steering. The extent of the power assisted steering is at a minimum for this position. When there is a low electric load current 5 through the solenoid valve, the solenoid valve can be open, and the hydraulic flow in the hydraulic circuit of the power assisted steering is at a maximum. The extent of the power assisted steering can be at a maximum for this position.

The position of the solenoid valve depends on the actual effective value 11 of the electric load current. The effective value is the root mean square value of the electric load current 5. The actual effective value 11 of the electric load current is inversely proportional to the degree of opening of the solenoid valve. A pulse-width modulated voltage pulse sequence 4 is used to actuate the solenoid valve. This means that the actual effective value 11 of the electric load current is controlled by means of the pulse width of the voltage pulse sequence 4. A sensor unit 24 for determining the actual effective value 11 can be connected to the controller device 1 and the time-variant load 2 in an electrically conductive manner for the duration of the calibration of the controller device 1. The sensor unit 24 can be removed after the calibration.

Figure 2:
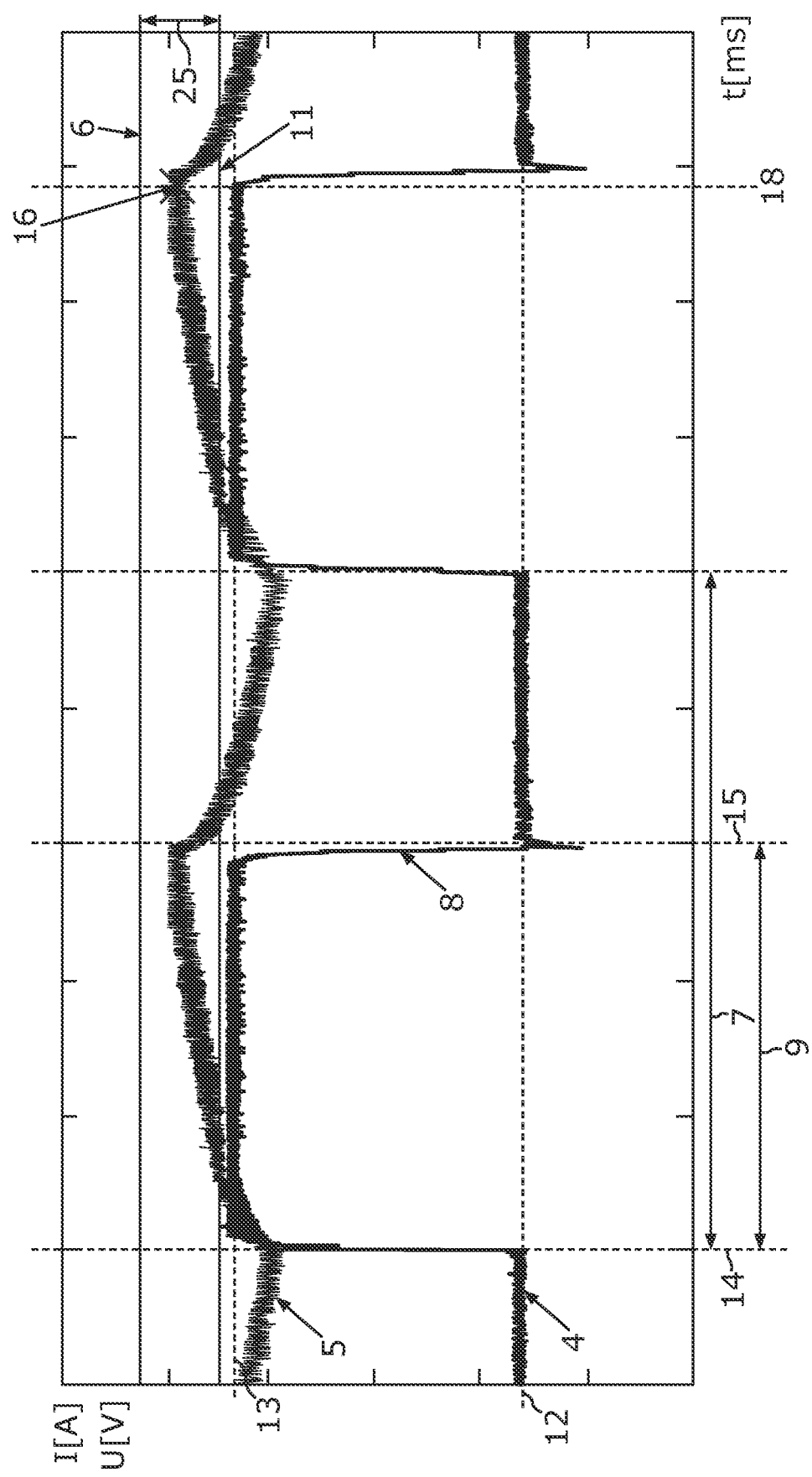
FIG. 2 shows a curve of the load current I.

FIG. 2 shows a curve of the load current 5. The voltage pulse sequence 4, which may be a square wave function, can be applied to the time-variant load 2 by the controller device 1. The voltage pulse sequence 4 can have two voltage levels 12 and 13, where the value of the voltage U can have the upper voltage level 13 during a pulse 8, and the lower voltage level 12 outside a pulse 8. The pulse 8 can have the pulse duration 9, and the voltage pulse sequence 4 can have the period 7. The pulse duration 9 can be bounded by a time of a rising edge 14 and a time of a falling edge 15. From the time of the rising edge 14 onwards, the value of the load current 5 can rise. From the time of the falling edge 15 onwards, the load current 5 flowing through the time-variant load 2 can fall exponentially. The actual effective value 11 of the electric load current flowing through the time-variant load 2 can be defined by defining the duty cycle 10, and thus the ratio between the period 7 and the pulse duration 9.

In order to be able to determine the exact value of the actual effective value 11 of the electric load current, in the prior art it is necessary to perform an integration over the curve of the load current 5 by means of an analog circuit or software. The two methods have the disadvantage that this involves effort, and additional components must be provided.

In the method presented, it can be provided for the purpose of determining the actual effective value 11 of the electric load current that instead of integrating over the load current 5, a sample value 16 of the electric load current is acquired during at least one pulse 8 of the voltage pulse sequence 4. For example, it can be provided that the controller device 1 acquires the sample value 16 of the electric load current in a final tenth of the phase of the pulse 8. The controller device 1 can determine the actual effective value 11 of the electric load current by the controller device 1 retrieving the actual effective value 11 of the electric load current, which value is stored for the particular sample value 16 in a dependency 17. The dependency 17 may be a function or a characteristic-value table, for instance, which can be stored in the controller device 1. The sampling time 18 for the sample value 16 can lie in a final tenth of the phase of the pulse 8.

Figure 3:
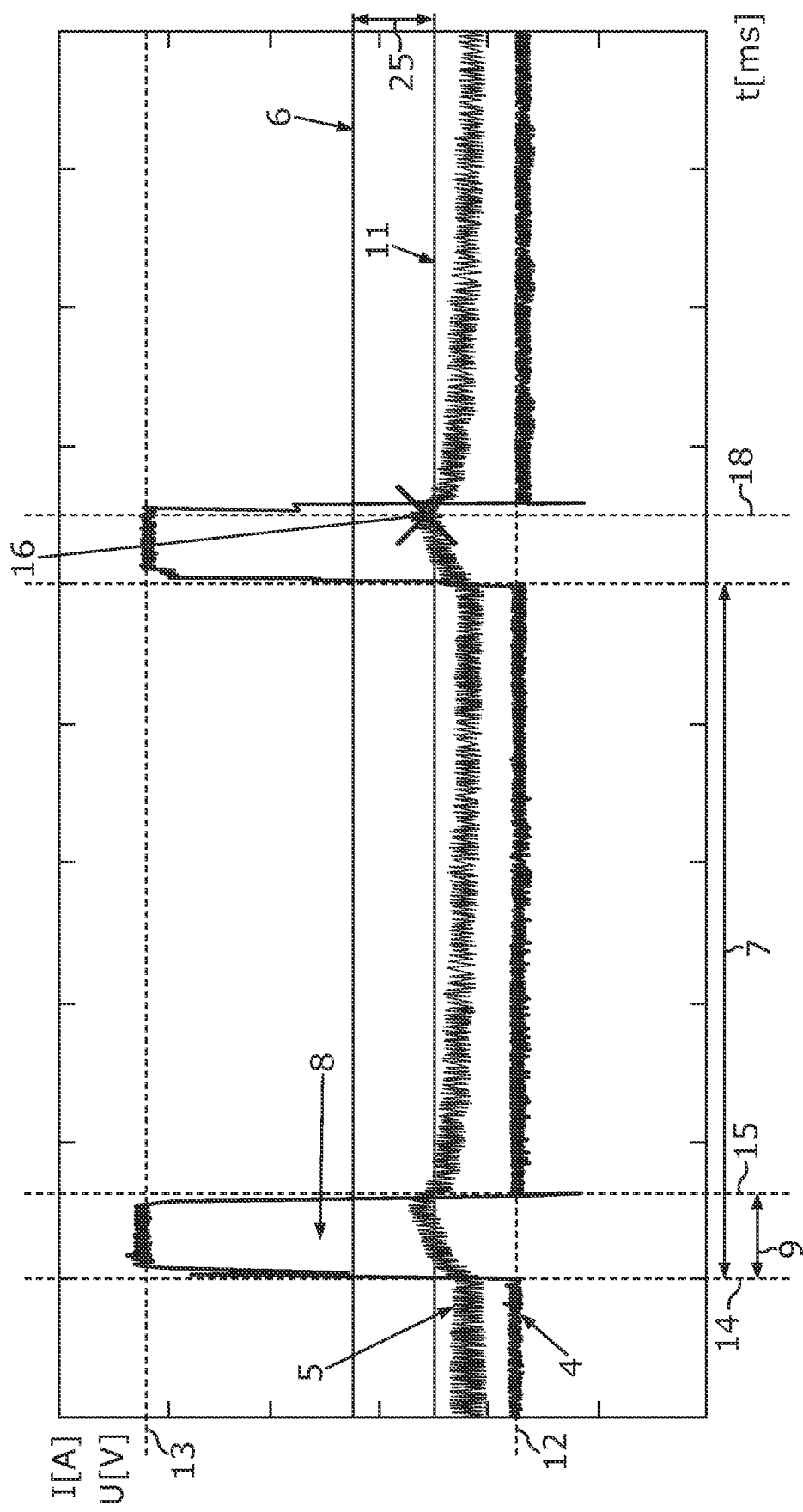
FIG. 3 shows a further curve of the load current I.

FIG. 3 shows a further possible curve of a load current 5. It shows a further voltage pulse sequence 4, in which the lower voltage level 12 and the upper voltage level 13 can be identical to those in FIG. 2. The voltage pulse sequences 4 shown in FIG. 3 can have a smaller duty cycle 10 than the voltage pulse sequence 4 in FIG. 2. The pulse duration 9 can be shorter, for instance, which means that the actual effective value 11 of the electric load current can have a smaller value than the actual effective value 11 of the electric load current in FIG. 2. The sampling time 18 for the sample value 16 can take place at the same phase angle as in FIG. 2. As a result of the shorter pulse duration 9, the sample value 16 in FIG. 3 can have a smaller value than the sample value 16 in FIG. 2.

Figure 4:
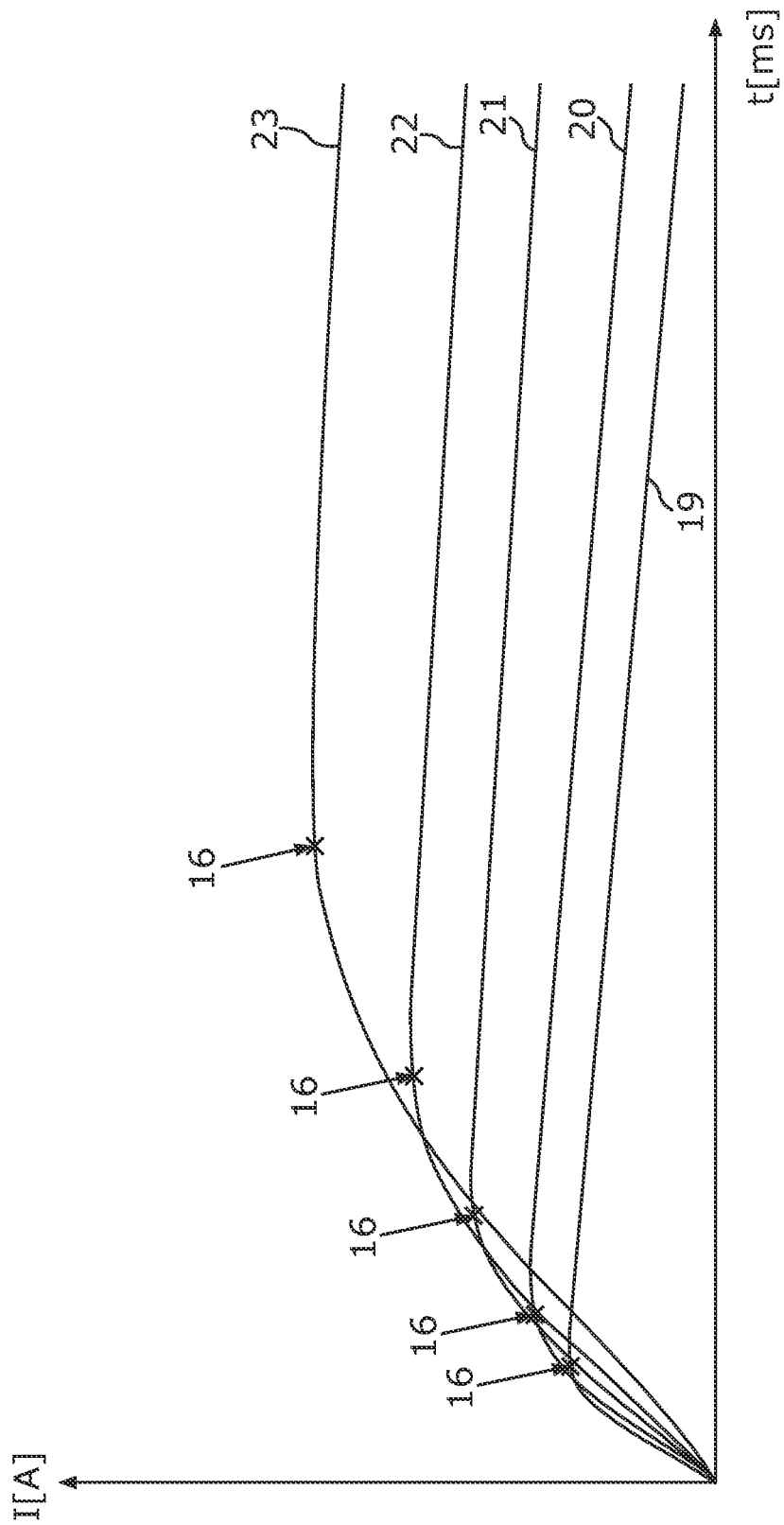
FIG. 4 shows current-curves I according to the corresponding duty cycle X.

FIG. 4 shows curves of the electric load current 5 according to the corresponding duty cycle 10. The depicted curves of the electric load current 5 can be produced by respective calibration voltage pulse sequences 19, 20, 21, 22, 23, which can have identical lower voltage levels 12 and identical upper voltage levels 13, and which can differ from one another in terms of their duty cycle 10. The duty cycles 10 of the associated calibration voltage pulse sequences 19, 20, 21, 22, 23 can equal 12%, 24%, 36%, 48% and 60% for example. The sample value 16 of each curve of the load current 5 is acquired in the final tenth of the pulse phase 8. It can be seen that both the curve of the load current 5 and the value of the sample value 16 of the electric load current rise according to the selected duty cycle 10. Thus, overall a relationship is obtained between the sample value 16 and the actual effective value 11 of the electric load current. This relationship is used to generate the dependency 17 stored in the controller device 1. In order to produce the dependency 17, the calibration voltage pulse sequences 19, 20, 21, 22, 23 can be provided successively at the time-variant load 2.

The controller device 1 can acquire the relevant sample value 16 for each of the calibration voltage pulse sequences 19, 20, 21, 22, 23. The actual effective value 11 of the electric load current is determined by a sensor unit 24. The actual effective value 11 of the electric load current can be transferred by the sensor unit 24 to the controller device 1, where it can assigned to the corresponding acquired sample value 16 in the dependency 17. It may be provided, for example, that the controller device 1 creates a characterizing function as the dependency 17, which can be used to calculate for the acquired sample value 16 of the electric load current the associated actual effective value 11 of the electric load current. Alternatively, it can be provided that the dependency 17 is a characteristic-value table, in which are stored the respective actual effective values 11 of the electric load current and the associated corresponding sample values 16.

FIG. 5 shows a dependency 17. The dependency 17 may be a characteristic-value table, for instance. An example of a characteristic-value table is shown, in which are assigned to the respective sample values 16 the corresponding actual effective value 11 of the electric load current.

FIG. 6 shows a possible sequence of a method. The method can be performed by a control device or controller device 1, for example, in order to provide a setpoint effective value 6 of an electric load current at a time-variant load 2. In a first step S1, the controller device 1 can provide a voltage pulse sequence 4 having a predetermined duty cycle 10, as a result of which an electric load current can flow through the time-variant load 2 and the controller device 1. The controller device 1 can acquire a sample value 16 of the load current at a predetermined sampling time 18.

In a step S2, the controller device 1 can determine the actual effective value 11 of the electric load current, where this can be achieved, for example, by means of a dependency 17 in the form of a characterizing function or characteristic-value table. In this process, the controller device 1 can calculate or retrieve for the sample value 16 the associated actual effective value 11 of the electric load current.

In a step S3, it can be provided that the controller device 1 compares the determined actual effective value 11 of the electric load current with the setpoint effective value 6 to be achieved for the electric load current, in order to determine a difference value 25 of the electric load current.

In a step S4, it can be provided that the controller device 1 calculates an adapted duty cycle 26 for the voltage pulse sequence 4 according to the difference value 25 of the electric load current. The controller device 1 can modify the duty cycle 10 of the voltage pulse sequence 4, whereby the voltage pulse sequence 4 can be replaced by an adapted voltage pulse sequence 27 having the adapted duty cycle 26.

The method can be performed at least once. In a further step, it can be provided that the method is repeated from step S1. Overall, the example shows how the invention can make it possible to reduce the number of components for controlling an effective value of a load current.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the scope of the following claims.

The invention claimed is:

1. A controller device for controlling an effective value of an electric load current at a time-variant load, wherein the controller device includes instructions for:
    providing at the time-variant load a voltage pulse sequence having a predetermined duty cycle;
    acquiring a sample value of the electric load current at the time-variant load in at least one pulse phase of the voltage pulse sequence, wherein acquiring the sample value of the electric load current is performed in a final tenth of the at least one pulse phase;
    setting a pulse duration of less than 5*tau of the time-variant load, wherein tau is the time constant of the time-variant load and represents an inductance of the load divided by a resistance of the load, and determining, in a plurality of the pulse phases of the voltage pulse sequence, the duty cycle according to the sample value obtained in the corresponding pulse phase;
    determining an actual effective value of the electric load current with a dependency stored in the controller device, wherein the actual effective value is assigned to the sample value of the electric load current;
    determining a difference value between the actual effective value of the electric load current and a setpoint effective value of the electric load current;
    determining an adapted duty cycle of the voltage pulse sequence from the difference value of the electric load current; and
    providing at the time-variant load an adapted voltage pulse sequence having the adapted duty cycle, wherein the time-variant load is a solenoid valve for governing a hydraulic flow in power assisted steering of a vehicle.

2. The controller device as claimed in claim 1, wherein the dependency is a characteristic-value table.

3. The controller device as claimed in claim 1, wherein the dependency is a characterizing function.

4. The controller device as claimed in claim 1, further comprising providing the voltage pulse sequence at a period of the voltage pulse sequence of 1.5 ms to 3.5 ms.

5. The controller device as claimed in claim 1, further comprising providing the voltage pulse sequence as a square wave signal.

6. The controller device as claimed in claim 1, further comprising acquiring the sample value of the electric load current at an acquisition period that is an integer multiple of the period of the voltage pulse sequence.

7. The controller device as claimed in claim 1, wherein the dependency is specific to the time-variant load.

8. The controller device as claimed in claim 1, wherein the controller device comprises a power MOSFET.

9. A method for controlling an effective value of an electric load current at a time-variant load comprising:
    providing with a controller device successively at a time-variant load a plurality of calibration voltage pulse sequences having a particular duty cycle, wherein the calibration voltage pulse sequences equal 12%, 24%, 36%, 48%, and 60%;
    acquiring a sample value of the electric load current at the time-variant load in at least one pulse phase of the respective calibration voltage pulse sequences, wherein acquiring the sample value of the electric load current is performed in a final tenth of the at least one pulse phase;
    setting a pulse duration of less than 5*tau of the time-variant load, wherein tau is the time constant of the time-variant load and represents an inductance of the load divided by a resistance of the load, and determining, in a plurality of the pulse phases of the voltage pulse sequence, the duty cycle according to the sample value obtained in the corresponding pulse phase;
    acquiring from a sensor unit an actual effective value of the electric load current at the time-variant load for at least one period of the respective calibration voltage pulse sequences;
    transferring the actual effective value of the electric load current from the sensor unit to the controller device;
    generating and storing with the controller device a dependency, in which the respective sample values of the electric load current and the respective duty cycles of the calibration voltage pulse sequences are assigned the corresponding actual effective value of the electric load current;
    providing with the controller device at the time-variant load a voltage pulse sequence having the duty cycle;
    acquiring with the controller device the sample value of the electric load current at the time-variant load in at least one pulse phase of the voltage pulse sequence;
    determining with the dependency stored in the controller device the actual effective value of the electric load current, which value is assigned to the sample value of the electric load current and to the duty cycle of the voltage pulse sequence;
    determining with the controller device a difference value between the actual effective value of the electric load current and a setpoint effective value of the electric load current;
    determining with the controller device an adapted duty cycle of the voltage pulse sequence from the difference value of the electric load current; and
    providing with the controller device at the time-variant load an adapted voltage pulse sequence having the adapted duty cycle.

10. The method claim 9, wherein the dependency is one of a characteristic-value table and a characterizing function.

11. The method claim 9, further comprising providing the voltage pulse sequence at a period of the voltage pulse sequence of 1.5 ms to 3.5 ms.

12. The method claim 9, further comprising acquiring the sample value of the electric load current at an acquisition period that is an integer multiple of the period of the voltage pulse sequence.

13. The method claim 9, wherein the dependency is specific to the time-variant load.

* * * * *